United States Patent
Fleurial et al.

(10) Patent No.: US 6,288,321 B1
(45) Date of Patent: *Sep. 11, 2001

(54) ELECTRONIC DEVICE FEATURING THERMOELECTRIC POWER GENERATION

(75) Inventors: Jean-Pierre Fleurial, Duarte; N. Thomas Olson, La Jolla; Alexander Borshchevsky, Santa Monica; Thierry Caillat, Pasadena; Elizabeth Kolawa, Bradbury; M. Amy Ryan, Pasadena; Wayne M. Philips, Shadow Hills, all of CA (US)

(73) Assignee: California Institute of Technology, Pasadena, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/014,211

(22) Filed: Jan. 26, 1998

Related U.S. Application Data

(63) Continuation-in-part of application No. 08/598,193, filed on Feb. 7, 1996, now Pat. No. 5,712,448.
(51) Int. Cl.[7] ................................................. H01L 35/30
(52) U.S. Cl. .......................... 136/205; 136/201; 136/204; 136/237; 136/238; 136/240; 252/62.3 T
(58) Field of Search ..................................... 136/200, 201, 136/205, 204, 237, 238, 240; 310/306; 252/62.3 T

(56) References Cited

U.S. PATENT DOCUMENTS

| | | | |
|---|---|---|---|
| 5,102,470 | 4/1992 | Kodato et al. | 136/225 |
| 5,419,780 * | 5/1995 | Suski | 136/205 |
| 5,705,770 * | 1/1998 | Ogasawara et al. | 136/205 |
| 5,712,448 | 1/1998 | Vandersande et al. | |

OTHER PUBLICATIONS

Takahashi et al., Electrodeposition of Bi–Te Alloy Films, 09/93, J. Elecrochem Soc.

Chaouni, H., et al., "Texture of Electroplated Coatings of Copper and Bismuth Telluride", *Materials Science Forum*, vol. 157–162, pp. 1371–1377, Trans Tech Publications, Switzerland, 1994. No month given.

(List continued on next page.)

*Primary Examiner*—Kathryn Gorgos
*Assistant Examiner*—Thomas H Parsons
(74) *Attorney, Agent, or Firm*—Fish & Richardson P.C.

(57) ABSTRACT

A device for generating power to run an electronic component. The device includes a heat-conducting substrate (composed, e.g., of diamond or another high thermal conductivity material) disposed in thermal contact with a high temperature region. During operation, heat flows from the high temperature region into the heat-conducting substrate, from which the heat flows into the electrical power generator. A thermoelectric material (e.g., a $Bi_2Te_3$-based film or other thermoelectric material) is placed in thermal contact with the heat-conducting substrate. A low temperature region is located on the side of the thermoelectric material opposite that of the high temperature region. The thermal gradient generates electrical power and drives an electrical component.

16 Claims, 5 Drawing Sheets

OTHER PUBLICATIONS

Magri, P., et al., "Analyse volumétrique pour le contrôle de solutions et d'alliages de bismuth et de tellure", *Laboratoire d'électrochimie des matériaux,* URA CNRS 158, université de Metz, Île–du–Saulcy, 57045 Metz cedex, France, May 22, 1996.

Magri, P., et al., "Electrodeposition of $Bi_2Te_3$ Films", *American Insititute of Physics. Laboratoire d'Electrochimie des Matériauzx,* URA CNRS 158, Ile de Saulcy, 57045 Metz Cedex—France 1995. No month given.

Takahashik, Makoto, et al., "Electrodeposition of Bi–Te Alloy Films", *J. Electrochemical Society,* vol. 140 No.9, Sep. 1993.

Kacsich, et al., Films of Ni–7at.%V, Pd, Pt, and Ta–Si–N as Cu Diffusion Barriers of $Bi_2Te_3$, *California Institute of Technology,* 23 pages. No month and year given.

Fluerial, et al., Thermoelectric Microcoolers for Thermal Management Applications, *Proceedings of the XVI International conference on Thermoelectrics*, Dresden, Germany, Aug. 26–29, 5 pages, 1997.

Jean–Pierre Fleurial, Thermoelectric Power Conversion, *California Institute of Technology,* 12 pages. No month and year given.

Advertisement for Citizen, Thermoelectric Generation Wrist Watch, Nikkei Daily, Jan. 26, 1998.

Wu, A Silent Cool, *Science News,* vol. 152, pp. 152–153, Sep. 6, 1997.

\* cited by examiner

ELECTRONIC DEVICE FEATURING THERMOELECTRIC POWER GENERATION

CROSS REFERENCE TO RELATED APPLICATIONS

This application is a continuation-in-part of U.S. patent application Ser. No.08/598,193 now U.S. Pat. No. 5,712,448, entitled "Cooling Device Featuring Thermoelectric and Diamond Materials for Temperature Control of Heat-Dissipating Devices" filed Feb. 7, 1996, to J. W. Vandersande, R. Ewell, J. P. Fleurial, and H. Lyon.

ORIGIN OF THE INVENTION

The invention described herein was made in the performance of work under a NASA contract, and is subject to the provisions of Public Law 96-517 (35 Title U.S.C. 202) in which the contractor has elected to retain title.

FIELD OF THE INVENTION

This invention relates to devices employing thermoelectric power generators, and more particularly to small electronic devices, such as consumer electronics, having small thermoelectric power generators as their power sources.

BACKGROUND AND SUMMARY OF THE INVENTION

Small electronic devices, such as those employing integrated circuits, continue to play a major role in all aspects of society. Batteries have traditionally been used to power such devices. Non-traditional energy sources include, e.g., solar power.

A disadvantage of batteries is, of course, that their energy dissipates over time, requiring battery replacement or recharging. A disadvantage of solar power is that the sun or other light sources are not always available, and the power output is generally not large.

One way to power such devices may be to use thermoelectric effects. Thermoelectric devices are based on two transport phenomena: the Seebeck effect for power generation and the Peltier effect for electronic refrigeration. If a steady temperature gradient is applied along a conducting sample, the initially uniform charge carriers' distribution is disturbed as the free carriers located at the high temperature end diffuse to the low temperature end. This results in the generation of a back emf which opposes any further diffusion current. The open circuit voltage when no current flows is the Seebeck voltage. When the junctions of a circuit formed from two dissimilar conductors (n- and p-type semiconductors) connected electrically in series but thermally in parallel are maintained at different temperatures $T_1$ and $T_2$, the open circuit voltage V developed is given by $V = S_{pn} (T_{1-T2})$, where $S_{pn}$ is the Seebeck coefficient expressed in $\mu V.K^{-1}$. The complementary Peltier effects arise when an electrical current I passes through the junction. A temperature gradient is then established across the junctions and the corresponding rate of reversible heat absorption Q is given by $Q = \Pi_{pn} I$, where $\Pi_{pn}$ is the Peltier coefficient expressed in W.A⁻or V.

Methods employing the Seebeck effect are particularly suited to microelectronic circuits because only a small amount of power is usually necessary to power these circuits.

Previous investigators have used the Peltier effect, where an applied voltage creates a hot and cold surface, to conduct away heat in microelectronic circuits using thermoelectric ("TE") coolers. TE coolers were proposed in which an applied voltage resulted in heat conduction away from an affected zone. When a current source is used to deliver electrical power to a thermoelectric device, heat can be pumped from $T_1$ to $T_2$ and the device thus operates as a refrigerator. As in the case of a thermoelectric generator, the operation of a thermoelectric cooler depends solely upon the properties of the p-n thermocouple materials, expressed in terms of the figure of merit $Z_{pn}$ and the two temperatures $T_c$ and $T_h$. The conversion efficiency COP of a thermoelectric refrigerator is determined by the ratio of the cooling power pumped at the cold junction to the electrical power input from the current source, and is given by:

$$COP = \frac{S_{pn}T_c I - \frac{1}{2}RI^2 - K(T_h - T_c)}{S_{pn}(T_h - T_c)I + RI^2}$$

Details of such effects are provided in "Thermoelectric Power Conversion", by Jean-Pierre Fleurial; "Thermoelectric Microcoolers for Thermal Management Applications", by Fleurial, et al.; and "Films of Ni-7at. %V, Pd, Pt, and Ta-Si-N as Cu Diffusion Barriers for $Bi_2Te_3$", by Kacsich, et al., all of which are incorporated by reference herein.

The thermoelectric materials are sandwiched between a pair of alumina (a well-known ceramic) substrates to form the structure. Alumina was used in this configuration to electrically isolate the thermoelectric material. These cooling devices could also utilize a diamond substrate. Diamond has the highest thermal conductivity (about 2400 $Wm^{-1}K^{-1}$) of any known material. Diamond also has an extremely high degree of hardness, and is an excellent electrical insulator. A thermoelectric material, such as $Bi_2Te_3$ and $Bi_2Te_3$-based alloys (in bulk or film form), was used as the heat-pumping component.

Alumina, $Bi_2Te_3$-based materials, and diamond may also be employed in the devices of the invention. In these devices, a "natural" temperature gradient may be used to generate power through the Seebeck effect rather than having an applied electric power result in heat pumped through a temperature differential. The power output of the TE device may then be used to power electronic circuits. E.g., a watch may be powered using the pre-existing temperature differential between a wearer's wrist and the ambient atmosphere. Of course, this power-generation function may be very widely applied to other devices in which a temperature differential is available.

The thermoelectric material may be $Bi_2Te_3$-based, and may be disposed between a first and second substrate. This material is patterned as a series of alternating n and p-type regions, or "legs", on the substrates. The legs may have square or rectangular cross sections or other suitable shape and may be arranged in a two-dimensional "checkerboard" pattern so that they are electrically in series and thermally in parallel. Of course, the voltage potential can be controlled by connecting some of the legs in parallel as well.

These devices may be constructed using microfabrication techniques. Microfabrication techniques are suitable because many hundreds or thousands of legs can be deposited and offer the potential to achieve an appropriate voltage/current combination for a given temperature differential across a device. Such techniques are also necessary to achieve the small size required for use in consumer electronics.

Films of $Bi_2Te_3$-based material deposited as legs on the substrates typically have thicknesses of between 1–100 microns. As may be seen in FIG. 1, the power output of the device increases (for a given cross-sectional area) as the thermoelectric legs become thinner for a given temperature difference. This results in a higher output power density. Thin films of the thermoelectric material are therefore better if the thermal resistances or electrical contact resistances are low or negligible. Thin films also allow fabrication by IC fabrication technology as mentioned above.

Electrically insulating materials having high-thermal conductivities, such as silicon carbide, aluminum nitride, boron nitride, or beryllium oxide, may be used in place of the diamond substrates. Other materials with similar electrically insulating and thermally conducting properties (i.e., as close to diamond as possible) could also be used.

The desirable properties of diamond and materials having similar properties enhance the effectiveness of the device. During operation, input heat from the hot side is rapidly and evenly spread out so that the substrate efficiently supplies heat to all the n and p legs.

The thermoelectric material employs a thermal gradient to generate power. The thermal gradient for a chronometer, e.g., a wristwatch, may be created by one side of the watch being exposed to the air (the cool side) and the other side being exposed to the wearer's wrist (the hot side) as mentioned above.

The thermoelectric material may be placed in thermal contact with the first substrate. Here, "thermal contact" and "thermally attached" can encompass any connection where heat easily flows from one material to another. This does not necessarily require that the materials be in direct contact. A metallization layer (described below) may be disposed between the substrate and the thermoelectric material to ensure that these materials are in thermal contact and mechanically attached.

A multi-layer upper stack structure can be used to attach the thermoelectric material of the first substrate. The stack structure preferably contains electrically and thermally conductive materials. Electrically conductive materials are required as they provide an in-series electrical connection between the p and n-doped legs of the thermoelectric material. A low electrical contact resistance between the electrically conductive materials and the thermoelectric legs is desirable. This reduces the total internal electrical resistance of the device and prevents degradation of its performance.

Thermally conductive materials within the stack structure facilitate heat flow between the thermoelectric material and the substrate. A low thermal resistance between the heat-dissipating device and the thermoelectric material reduces heat losses. These combined factors prevent a degradation in the device's performance. A lower stack structure having a similar multi-layer configuration (and similar electrical and thermal properties) connects the thermoelectric material to the second heat-conducting substrate.

A preferred multi-layer upper stack structure includes a metallization layer coated on the inner surface of the substrate. This thin metal coating facilitates adhesion of the substrate to other materials. In preferred embodiments, metals such as titanium or chromium are used as the substrate metallization layers. An outer diffusion barrier layer, preferably composed of ternary alloys of metal-Si-N, where the metal is a transition metal such as Ti or Ta, is then deposited on the metallization layer. The outer diffusion barrier layer prevents the diffusion of copper to the metallization layer and to the substrate. Depending on temperature, the outer diffusion barrier may not be required. E.g., at room temperature, the outer diffusion barrier may not be needed to prevent interdiffusion. A copper layer is deposited on the outer diffusion barrier layer. An inner diffusion barrier layer, preferably composed of Pt or metal-Si-N, is then deposited on the copper layer. The inner diffusion barrier layer impedes the diffusion of copper (which has a high solid-state solubility and thus diffuses rapidly) into either the metallization layers or the thermoelectric material. Impeding the diffusion of copper prevents contamination of the other materials in the stack structure. An electrical contact layer, preferably including one of the transition metals, may be deposited if required on the inner diffusion barrier layer to complete the multi-layer upper stack structure.

P and n-doped thermoelectric legs of the desired thickness are then deposited on the electrical contact layer. A second electrical contact layer, followed by a second inner diffusion barrier layer, is deposited on the legs.

Each layer of the stack structures is preferably deposited using semiconductor device fabrication techniques. Photolithography and spatially filtering masks are preferably used to pattern the layers.

The major factors which limit the power output of the device include: 1) the temperature differential across the TE legs, which is a function of the series electrical resistance of the TE legs; 2) the electrical contact resistance provided by the upper and lower multi-layer stack structures; 3) the geometry and number of legs; and 4) the thermal resistances for heat transfer at the hot and cold surfaces of the legs. An increase in the available temperature differential will increase the thermal to electrical energy conversion efficiency.

The area of the substrates are larger than the area of the p and n leg region.

Preferably, the device is in direct contact with the hot region. Alternatively, the device may be in contact with a thermally conducting material which, in turn, is in direct contact with the hot region. Heat rejection from the cold side of the TEG could be to the ambient air or to another suitably cooler medium.

Other features of the invention will be evident from the following detailed description, and from the claims.

Table I shows tabulated layers of the device.

DETAILED DESCRIPTION

The power-generation device according to the invention features a thermoelectric material in the form of a 1–100 $\mu$m thick film, operating in combination with a diamond, or other high-thermal conductivity, high-electrical resistivity material, to utilize a thermal gradient in the generation of useful power.

In a preferred configuration, a first substrate has a surface which is placed in thermal contact with a "hot" region. During operation, heat flows away from the hot region and into the substrate. The heat is then incident from the substrate on a first surface of the thermoelectric material. A second surface of the thermoelectric material is kept cooler in operation than the first surface. This results in a voltage potential being created across points of the TEG device.

E.g., in a wristwatch application, the first substrate surface may be a skin-abutting surface and may be placed in contact with a user's wrist. The second substrate surface would be exposed to the ambient air.

Figure 2:
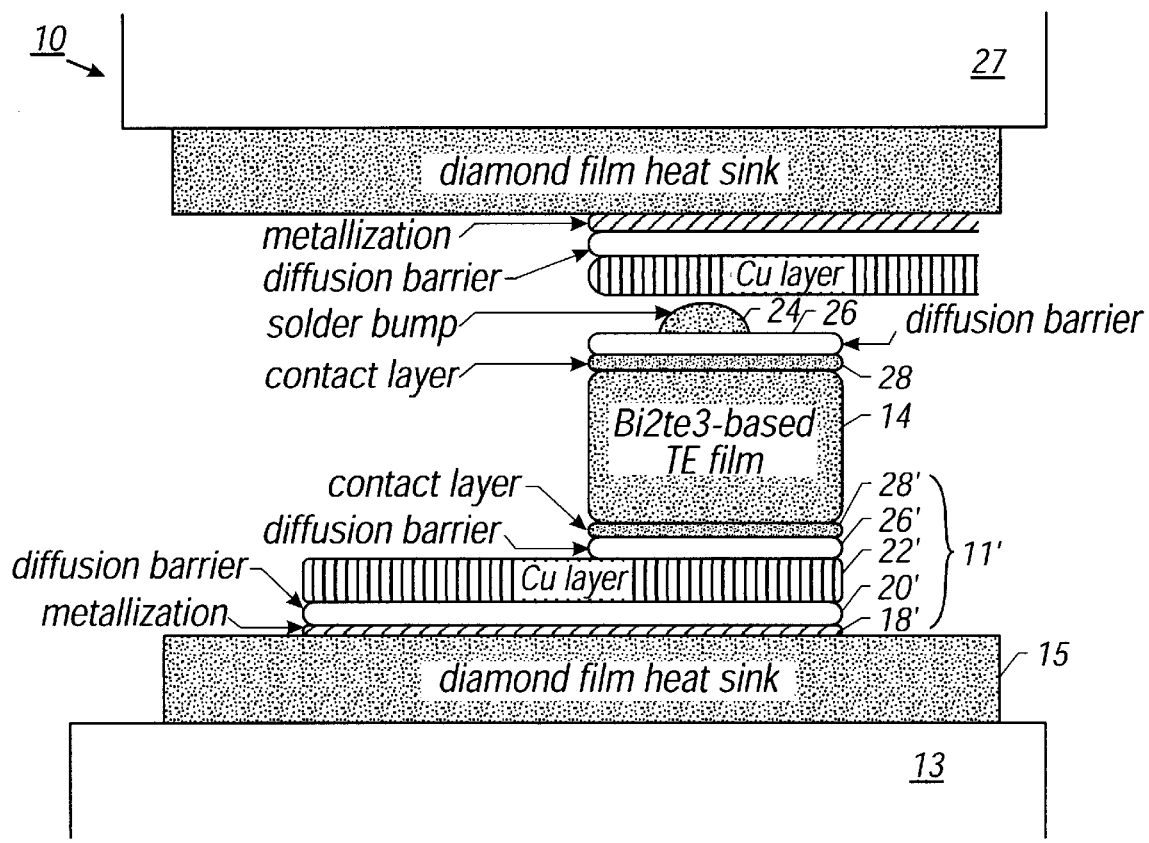
FIG. 2 is a cross-sectional side view of a power-generation device of the invention featuring a pair of substrates, upper and lower multi-layer stack structures, and a thick film thermoelectric leg.

FIG. 2 shows a device 10 for generating power using a temperature differential between a hot region 13 and a cooler region 27. Device 10 features an upper 12 and a lower 12' substrate positioned over the top and bottom surfaces of a $Bi_2Te_3$-based thermoelectric material 14. Cooler region 27 is shown adjacent upper substrate 12.

The general requirements for substrates 12, 12' are that they be a material having a high thermal conductivity and a high electrical resistivity. Suitable materials include diamond, alumina, aluminum nitride, high resistivity silicon, and other such materials having similar properties. Substrates 12, 12' may be in bulk form, e.g., about 100–1000 μm thick, e.g., 300 μm. The overall thickness of device 10 may be about 200–2000 μm, e.g., 700 μm, in some configurations. The exact dimensions are linked to the thermal environment and requirements of the device.

Figure 3:
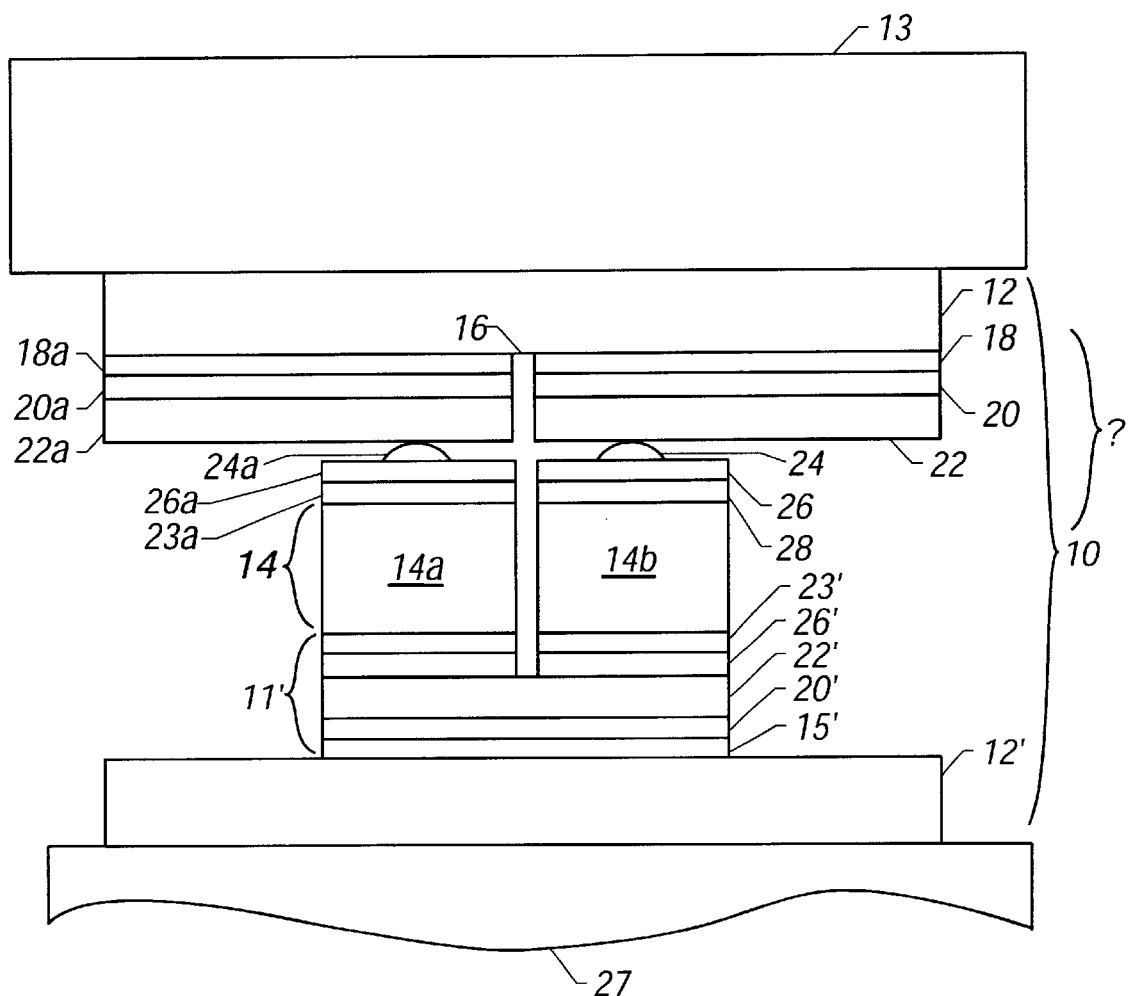
FIG. 3 shows a cross-section side view showing a pair of thermoelectric legs, a hot surface, and a cold surface.

Referring to FIG. 3, thermoelectric material 14 is composed of adjacent, alternately spaced p-doped 14a and n-doped 14b legs of the $Bi_2Te_3$-based semiconductor material. P and n-doped legs 14a and 14b are formed by doping $Bi_2Te_3$ alloys with suitable elements as described below. Thermoelectric thick film material 14 may be about 1–100 μm thick, e.g., 50 μm. These $Bi_2Te_3$-based materials are generally not bulk materials, but are deposited using microfabrication techniques, electrochemical deposition, vapor deposition, sputtering etc. Each leg is separated from substrates 12, 12' by an upper 11 and a lower 11' multi-layer stack structure.

Multi-layer structures 11, 11' include metallization layers 18, 18' for metallizing a portion of the substrates' surfaces. Metallization layers 18, 18' facilitate adhesion between each substrate and subsequent layers of upper stack structures 11, 11'. Metallization layers 18, 18' also provide good mechanical connections between the substrate and a diffusion barrier. In preferred embodiments, the metallization layers include titanium, chromium, or any other metallic material which can be used to bond subsequent layers.

Outer diffusion barrier layers 20, 20' are sandwiched between metallization layers 18, 18' and copper layers 22, 22'. Outer diffusion barrier layers 20, 20' prevent the diffusion of copper into the substrate and metallization layers. Copper diffusion into these layers causes problems such as disruption of the mechanical bond between the substrate and the metallization layers. Outer diffusion barrier layers 20, 20' preferably include ternary alloys of metal-Si-N or any other material suitable to prevent interdiffusion of copper.

Copper is used for layers 22, 22' as it has a high electrical conductivity, and thus can be used to efficiently conduct current from the p and n-doped thermoelectric legs. Copper is also an excellent thermal conductor and is used during operation to conduct heat from the substrates to the thermoelectric material.

Copper layer 22 is connected via solder to inner diffusion barrier layer 26. A wide range of metal alloys can be used as solder, with lead, tin, and indium alloys being preferred. Copper provides a solder-wettable surface when coated with a thin layer of nickel or palladium, and thus it may be desirable to deposit one of these materials prior to forming the solder. Generally, the solder should be placed between the Cu layer and the TE material: the specific location is variable.

Inner diffusion barrier layers 26, 26' are attached to electrical contact layers 28, 28' disposed on the surfaces of p and n-doped legs 14a, 14b. Inner diffusion barrier layers 26, 26' impede the diffusion of the copper into thermoelectric material 14. This is particularly important for $Bi_2Te_3$-based materials, which are easily contaminated with trace amounts of foreign material. Inner diffusion barrier layers 26, 26' also effectively impede the out-diffusion of thermoelectric material into the copper and metallization layers. Preferably, these layers are "atomically opaque", meaning that atomic species are not readily diffused therein. Preferred materials for inner diffusion barrier layers 26, 26' are metal-Si-N and Pt. These materials are thermodynamically stable with respect to copper and, due to the lack of grain boundaries, do not contain diffusion paths which facilitate the passing of contaminants.

Electrical contact layers 28, 28' are solder-like and form ohmic junctions with the thermoelectric legs. It is preferable that these layers have low electrical resistivities to prevent a decrease in performance of the power-generation device. The electrical contact layers must also have substantial mechanical stability to withstand operating conditions (e.g., thermal cycling) of the device. Preferred low-resistivity materials for the contact layers include the transition metals and other similar materials, such as Bi, Sn, Pb, etc. Depending on the structure, such electrical contact layers may not be necessary.

The materials, thicknesses, and primary functions of each layer in the upper and lower stack structures of FIGS. 2 and 3 are summarized in Table I, below.

TABLE I

Layers of the Device

| Layer | Ref. Numeral | Material | Thickness | Function |
|---|---|---|---|---|
| Heat conducting substrates | 12, 12' | diamond | 100–1000 μm | thermal conductor |
| Metallization layers | 18, 18' | Ti, Cr | 0.02 μm | adhesion |
| Outer diffusion barrier layers | 20, 20' | metal-Si-N, Pt | 0.1 μm | prevents diffusion of Cu into substrate |
| Cu layers | 22, 22' | Cu | 0.1–5 μm | thermal/electrical conductor |
| Inner diffusion barrier layers | 26, 26', | metal-Si-N, Pt | 0.1 μm | prevents diffusion of Cu into TEG element |
| Electrical contact layers | 28, 28' | Trans. metals | 0.1 μm | electrical contact |
| Thermoelectric material | 14, 14a, 14b | $Bi_2Te_3$ (n, p-doped) or | 1–100 μm | thermoelectric generator |

TABLE I-continued

Layers of the Device

| Layer | Ref. Numeral | Material | Thickness | Function |
|---|---|---|---|---|
| | | alloys thereof | | |

Of course, the exact thickness and materials vary with the application.

Figure 4:
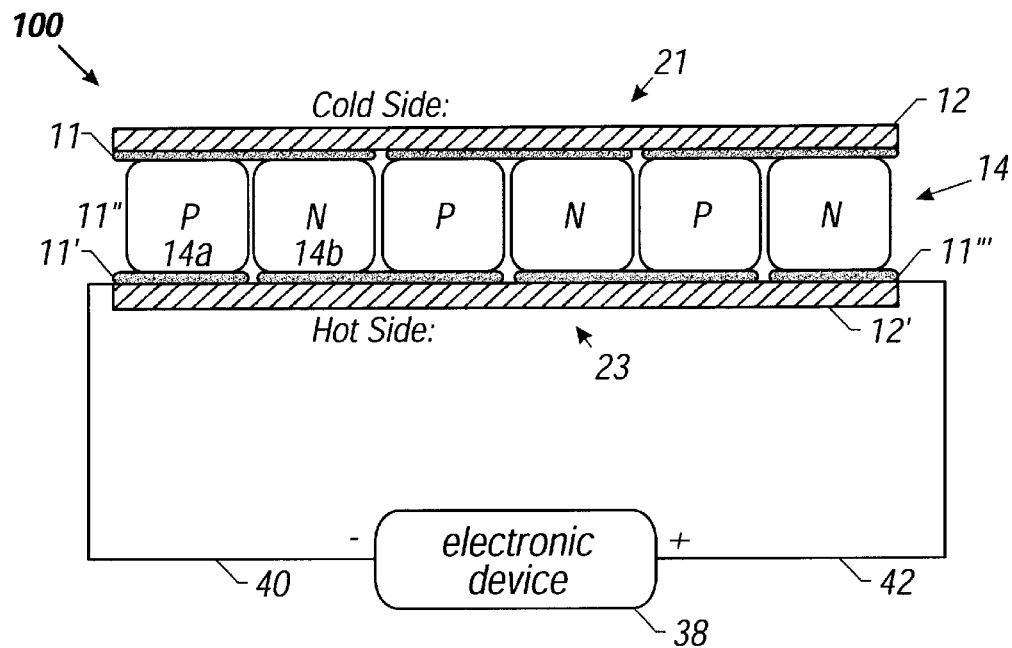
FIG. 4 is a cross-sectional side view of a thermoelectric device with a series of thermoelectric legs according to the invention.

FIG. 4 shows a side view of electronic device 100 employing a number of thermoelectric legs 14. Legs 14 are a series of alternating p-doped 14a and n-doped 14b legs electrically connected in series by multi-layer upper 11 and lower 11' stack structures and in particular by copper layers 22 and 22'.

Device 100 operates by a thermal gradient. For purposes of discussion, multi-layer upper stack structure 11 is assumed to be in contact with a lower temperature heat reservoir 21 than that contacting multi-layer lower stack structure 11' (shown as element 23). Thus, a thermal gradient is established between upper stack structure 11 and lower stack structure 11'. This causes an electrical potential to be produced between the hot and cold sides of the TE generator because of the Seebeck effect. A current will pass through the legs in one direction (shown in the figure as clockwise) if the TE generator is connected to an external load, such as electronic device 38.

Figure 5:
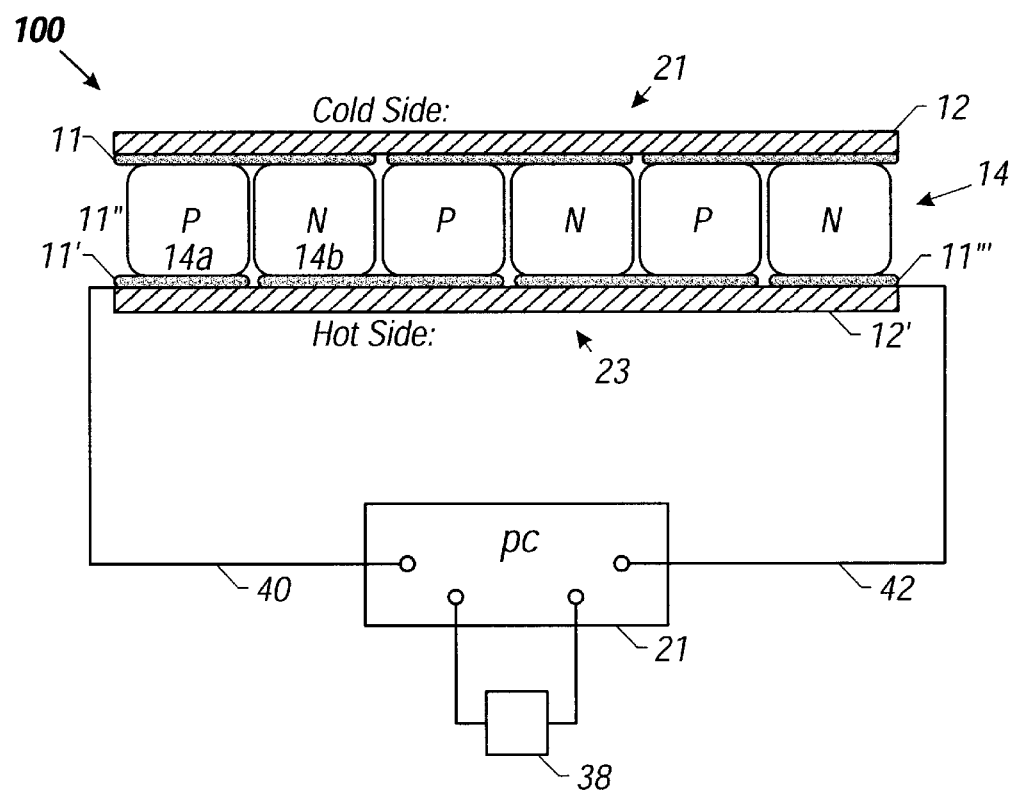
FIG. 5 is a side view of a TE device including a power conditioning module.

Referring to FIG. 5, this voltage and subsequent current can be used to power an electronic device 38 by application of a suitable power conditioning element 21.

E.g., in the case of a wristwatch, upper stack structure 11 is in thermal contact with the ambient air. Lower stack structure 11' is in thermal contact with the user's wrist, which is presumed to be warmer than the ambient air.

The generated current passes through a lead 40 to a first portion 11'' of lower stack structure 11'. Current flows from lower stack structure 11', through first p-doped leg 14a, and into upper stack structure 11. The current then proceeds to pass through successive p-doped and n-doped legs, finally exiting through a portion 11''' of lower stack structure 11'. The current then passes through a lead 42 back to electrical device 38 to complete the circuit.

As indicated by the figure, each p and n-doped leg of the thermoelectric material simultaneously creates a voltage from "cold" side 21, through the thermoelectric material, and to "hot side" 23.

Figure 1:
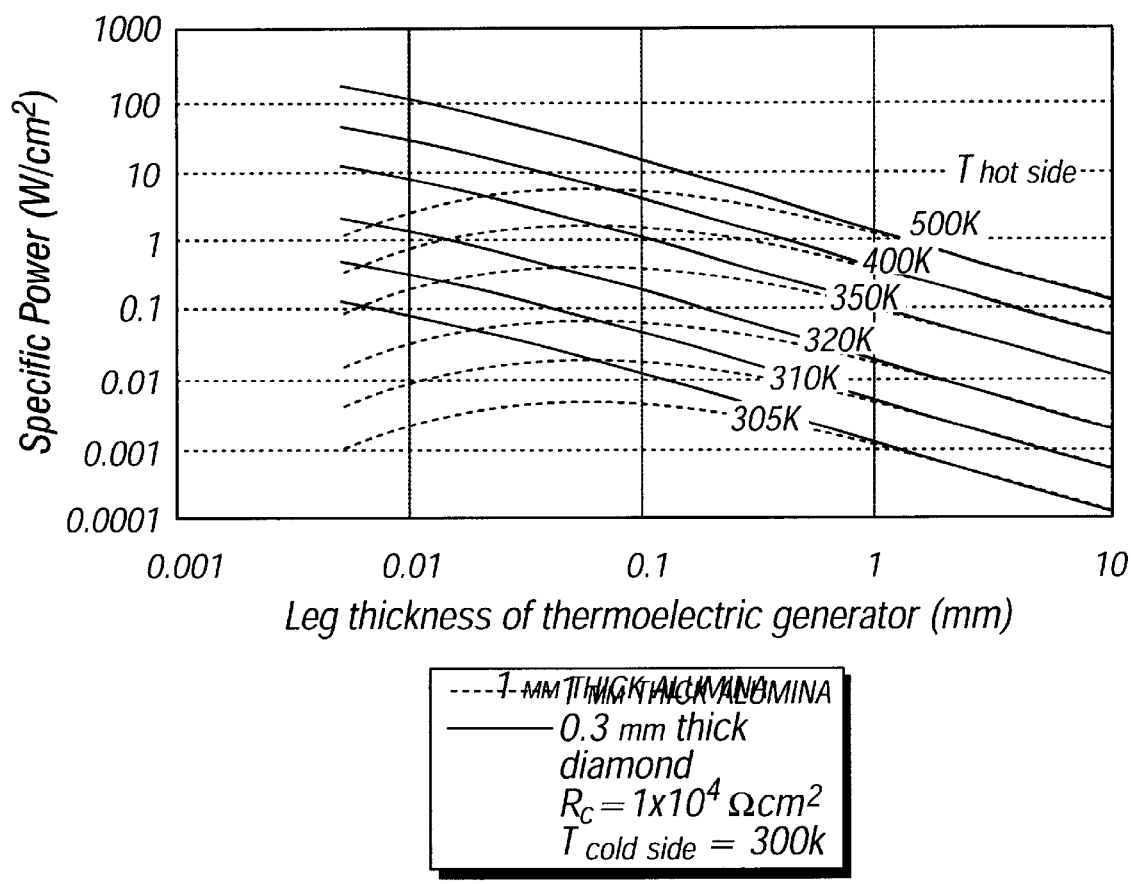
FIG. 1 is a graph of power output vs. leg thickness for a TE material.

During operation, heat first passes from the hot region to lower substrate 12'. As described above, heat is rapidly spread out and conducted due to the high thermal conductivity of the substrate. This process accumulates heat and directs the same to the thermoelectric elements. The presence of cold side 21 of the thermoelectric material results in a thermal gradient. The electrical power density (i.e., the electrical power per unit area generated by the device) is inversely proportional to the leg thickness for a given thermal gradient (see FIG. 1). Thus, thin thermoelectric legs (e.g., thicknesses of about 100 $\mu$m or less) result in high power densities. Details of such dependencies are described in "Thermoelectric Power Conversion", by Jean-Pierre Fleurial, incorporated by reference above.

Devices operating with low $\Delta T$ heat sources can require larger numbers of legs and electrical connections for operation. The overall effect can be to substantially increase the internal electrical resistance within the device and degrade its performance. Conversely, the thermal resistance decreases as the thickness of the thermoelectric legs decreases. These effects can decrease the efficiency of the device. Use of high thermal conductivity substrates (e.g., diamond) to conduct heat into and away from the thermoelectric elements is thus important for efficient operation of small-scale devices such as consumer electronics.

The electrical and thermal properties of the multi-layer upper and lower stack structures also affect the performance of the device. The efficiency of the device decreases as the electrical contact resistance between the n and p-doped legs containing the thermoelectric material is increased. The development of ohmic contacts to the p and n-doped legs becomes a large factor in determining the performance as the thickness of the thermoelectric material decreases. For instance, the electrical contact resistance between a bulk thermoelectric leg and the multi-layer stack structure is typically about $10^{-5}$ ohm-cm$^2$ for a device having a leg thickness greater than 1 millimeter. However, for a thick-film device with a leg thickness on the order of 10 $\mu$m, the electrical contact resistance between the stack structure and the leg must be reduced to about $10^{-6}$ ohm-cm$^2$ to prevent a substantial decrease in the energy conversion efficiency and the power density of device 10.

The device can be used to generate power under both steady-state and transient conditions. The device generally operates at high power levels proportional to the temperature differential of the hot and cold surfaces. For applications where the temperature differential is not constant, additional power conditioning may be required. Such transient conditions may be accounted for and dampened by use of a power control module 21 (see FIG. 5).

In a wristwatch, the resulting output voltage $V_{out}$ may vary somewhat throughout the typical user's day as the ambient temperature and the user's biological temperature (e.g., temperature of the user's wrist) varies. Power control module 21 may be designed to account for such variations.

Power control module 21 includes a power storage element, e.g., a rechargeable battery or a capacitor which stores the energy generated by the device at times when power output is above that needed to operate the load, such as a chronometer. Power control module 21 releases energy when power output is below that needed. In many cases, power control module 21 will be an active element. Power control module 21 effectively reduces power spikes in the device to improve performance.

During steady-state operation, the device may continually generate power for long periods of time. In this case, current is continuously generated by the device under a thermal gradient to effectively power the electronic device. In this situation, a power conditioning module may not be required.

The multi-layer stack structure shown in FIG. 2 is initially fabricated by depositing (or mechanically attaching) the conducting and diffusion barrier layers on a substrate. In general, all layers are formed and patterned using fabrication techniques commonly used in microelectronics. E.g., metals are sputtered, vacuum evaporated, or plasma deposited in reaction chambers as films. The processes for forming the different layers of the stack structure (especially the metallization and copper layers) may be performed in the same reaction chamber. Likewise, the thick film thermoelectric legs are typically deposited or attached to the stack structures using a separate reaction chamber or an electrochemical bath depending on the deposition technique as described below.

In a preferred fabrication method, the lower substrate is metallized to improve its adhesion to the diffusion barrier layers of the multi-layer stack structure. Metallization is performed by depositing a thin metal film on a surface of the substrate. The metallization layer is followed by sequential deposition of the outer diffusion barrier, copper, inner diffusion barrier, electrical contact, thermoelectric material, electrical contact, diffusion barrier, and solder bump.

The upper substrate is sequentially coated with metallization, diffusion barrier, and copper layers. These layers are preferably patterned on the upper substrate at the same time that the lower substrate is patterned. This can be done by placing the substrates side-by-side in the appropriate reaction chambers. As described above, deposition is preferably performed using plasma or sputter deposition or vacuum evaporation. The desired pattern of each film is then obtained using spatially filtering masks, photolithography, and etchants commonly used in microelectronics fabrication.

A solder bump 24 may be electroplated on a region of each diffusion barrier 26 (see FIG. 2). The upper and lower substrates are stacked on top of each other and aligned. The substrates are then heated to a temperature which melts solder bump 24 and solders the copper layer of the upper substrate to the exposed inner diffusion barrier layer of the lower substrate. Conventional soldering or brazing is not the preferred method for attaching the copper and diffusion barrier layers due to the small size of the doped legs. Solder bump 24 collapses and fuses copper 22 and diffusion barrier 26 layers on heating to its melting temperature. Surface tension of the molten solder prevents bridging between the neighboring doped legs of the thermoelectric material, thereby reducing the probability of electrical shorting during operation.

One way of depositing the TEG legs is by electrodeposition. In this way, once contact layer 28' is deposited as described above, the structure is placed in an electrodeposition bath and forms the cathode (or working electrode). Photoresist is previously applied on the entire area to be patterned. Patterns are etched onto the photoresist layer using photolithography where legs are not desired. A shallow Pt layer may be deposited on the structure prior to the structure entering the bath to protect the already-deposited layers.

For electrodeposition of n-type legs, the bath typically contains Bi, Te and Se. For electrodeposition of p-type legs, the bath typically contains Bi, Te, and Sb. The anode (or counter electrode) is located in the same electrodeposition bath. A reference electrode is also used, such as a calomel electrode. The electrodeposition bath is an acidic aqueous solution such as, e.g., a nitric acid solution. The bath may have a pH in a range of about −1 to +1, or approximately zero. Deposition rates on the order of tens of $\mu$m per hour may be achieved upon application of a suitable overpotential. With reference to a standard calomel electrode, voltages of about −5 mV up to about 60 mV can be used to deposit n-type BiTe or $Bi_2Te_{3-x}Se_x$. For depositing p-type $Bi_{2-x}Sb_xTe_3$ legs, voltages of 17 to 150 millivolts can be used. The molar concentration of Bi, Te, Se, and Sb can range from about $10^{-3}$ mol/liter up to about $10^{-2}$ mol/liter.

Thermoelectric $Bi_2Te_3$-based alloys can also be deposited as a film using the flash-evaporation method. In this technique, the $Bi_2Te_3$-based material, in the form of fine grains, is fed into a high-temperature heating chamber. The chamber is then evacuated and heated to the desired temperature. N-type $Bi_2Te_3$ can be grown by introducing an additional chalcogen source, such as tellurium or selenium, into the heating chamber. The stoichiometric amount of chalcogen can be varied by adjusting the temperature (and thus the vapor pressure) of the source material. Similarly, p-doped films can be grown by introducing additional bismuth, antimony, or tellurium to the source material, and by adjusting the temperature accordingly. Films having thicknesses on the order of a 10–20 $\mu$m can be formed with this method.

In other embodiments, the hot-wall method may be used to generate the $Bi_2Te_3$-based film. This technique is used to deposit films having thicknesses as high as about 30 $\mu$m. Here, the material to be evaporated is placed in a quartz tube located inside a vacuum chamber. A substrate and solid $Bi_2Te_3$-based material are placed, respectively, in the top and bottom portions of the tube. The substrate, tube walls, and $Bi_2Te_3$-based material are then heated to a temperature which causes the thermoelectric material to evaporate and form on the surface of the substrate. Individual n and p-doped materials are formed by feeding the appropriate doped material in bulk form in the chamber.

Thermoelectric films may also be deposited on the stack structures using other well-known techniques, such as chemical vapor deposition, molecular beam epitaxy, sputtering, or evaporation.

The patterns of the thermoelectric legs are isolated to assure that current flow only occurs in the spaces between the doped legs. Preferably, a "checker-board" pattern is formed. Typical spacing between the legs is between 5 and 100 microns. A typical cross section of both the n and p-doped legs within this pattern is 10×10 to 100×100 microns.

Diamond substrates (100 microns to 1 mm thick) can be obtained from a number of commercially available sources (e.g., Norton, Diamonex, Crystalline Materials, and General Electric). Materials, other than diamond, which may be used include: high purity silicon, aluminum nitride, or materials with similar properties available from, e.g. Carborundum Inc.

The performance of the device depends on the size of the thermoelectric legs, the number of legs, the temperature difference across the legs, the electrical contact resistance between these legs and the upper and lower stack structures, and the thermal resistance between the heat-dissipating device and the substrate.

A useful amount of electrical power for a TEG to produce to power an electronic device may be on the order of several tens to hundreds of microwatts at one volt in low $\Delta T$ environments.

EXAMPLE

A wristwatch application is described below as an example. It should be noted that any electronic device with similar power requirements may be powered similarly, as long as a thermal gradient is present.

$\Delta T$ may be as low as 1° C. for a wristwatch application. This low $\Delta T$ is assumed as an operating point due to uncertainty in the ambient environment and the efficiency of heat rejection. A desirable size for the TEG module may be in the range of about 1.5 mm×1.5 mm in such an application.

A basic heat collection area of 100 $mm^2$ is considered (e.g., 10 mm×10 mm) for purposes of this discussion. Heat rejection occurs from the outer edge of the watch front, or face (the center is typically glass). Thus, it may be desirable for the TEG to be positioned around the circumference of the watch interior, drawing heat from the solid back, and rejecting heat to the periphery of the front side.

A thermal analysis of one potential watch configuration has been performed. This analysis identifies the design operating temperature and a thermal resistance budget for the TEG device. One complication for the analysis is a large variation in the ambient environment for heat rejection (i.e., the air temperature and humidity) and the type of clothing being worn. An additional variable is the amount of time a watch is worn each day.

One possible design temperature differential identified by the analysis is 1° C. Using a figure of merit of 200 μV/° C. per BiTe leg, the TEG power source would require 5000 legs for the design temperature differential of 1° C. to produce the 1 volt (open circuit) required to run the watch.

Figure 6:
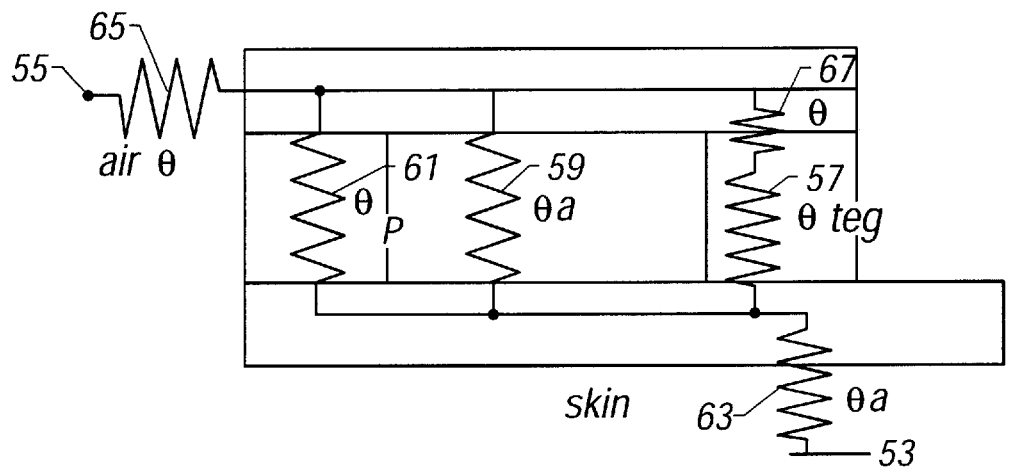
FIG. 6 is a schematic diagram showing an equivalent thermal circuit of the TEG generator in contact with skin and air.

The thermal resistance budget has been calculated as follows. FIG. 6 is an equivalent circuit and shows the conduction paths for the heat flow from a watch back 53 to a front surface 55. These include TEG elements $\theta_{TEG}$ 57, air resistance within the watch $\theta_a$ 59, skin contact resistance $\theta_s$ 63, a heat transfer resistance to the ambient air $\theta_0$ 65, a heat conduction resistance of other internal watch parts $\theta_p$ 61, and a contact resistance with the TEG $\theta_c$ 67.

As is known, resistance [K/W] is inversely proportional to conductance [W/K], and conductance equals conductivity times area divided by length [W/m-K]:

$$\theta = \frac{1}{\lambda} = \frac{L}{\lambda_0 s}$$

For the watch, $$\theta = \theta_0 + \left(\frac{1}{\theta_p} + \frac{1}{\theta_a} + \frac{1}{\theta_c + \theta_{TEG}}\right)^{-1} + \theta_s$$

Figure 7:
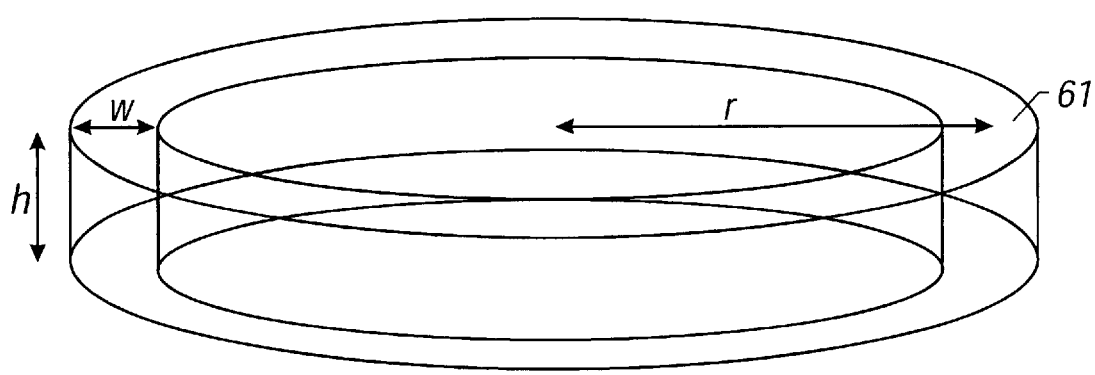
FIG. 7 is a view of a watch design showing a circumferential structure incorporating a TEG.

FIG. 7 shows a detail of the circumferential configuration of a watch body, which represents the major contribution to parallel heat flow. This configuration has a height h, a radial width w, and a radius (to the center of width w) of r. E.g., h may be about 4 mm, r about 20 mm, and w about 3 mm. Assuming a plastic body, $\lambda_{plastic}$ is about 0.2 W/m-K, and $\theta_p$ is about 50 K/W. In this analysis, values of $\theta_a$ of about 100 K/W and $\lambda_{Bi-Te}$ of about 1.5 W/m-K were also used. In the case of $\lambda_{Bi-Te}$, a $\theta_{TEG}$ of about 50 K/W was obtained.

From this analysis, a thermal resistance budget for the TEG element was established at a value of 50 K/W (equivalently, 50° C./W). This thermal resistance budget can be used to evaluate candidate TEG configurations which produce the required voltage and power and have an acceptably high thermal resistance.

Although only a few embodiments have been described in detail above, those having ordinary skill in the art will certainly understand that many modifications are possible in the preferred embodiment without departing from the teachings thereof. All such modifications are intended to be encompassed within the following claims. E.g., other materials can be substituted for the $Bi_2Te_3$-based material to achieve different performances and temperature ranges. Some suitable materials exhibit a ZT value greater than 1, where ZT is a figure of merit defined as:

$$ZT = \frac{ST^2}{(\rho \cdot k)}$$

where S is the material's Seebeck coefficient, ρ is the electrical resistivity, and k is the thermal conductivity. In general, however, this depends on the application. For example, such a criterion may not be applicable for waste heat recovery systems, etc.

In other embodiments, each of the materials listed in Table I may be replaced with another material having suitable electronic, thermal, and mechanical properties and substituted into the power-generating device. The structures of the upper and lower stack structures can also be modified.

High-thermal conductivity materials, such as silicon carbide, or related materials, such as aluminum nitride, boron nitride, or beryllium oxide have properties close to those for diamond. In general, these materials are electrical insulators, have high thermal conductivities, and are durable. Other materials having desirable thermal, mechanical, and electrical properties, such as ceramics or polymers, may also be used.

Still other embodiments are within the scope of the following claims.

What is claimed is:

1. A device employing a high-temperature surface and a low temperature surface to generate power to run an electrical component, comprising:

a diamond or high thermal conductivity and high electrical resistivity substrate in thermal contact with the hot surface, the substrate containing at least one portion which extends outside of a perimeter of the device such that heat flows from the high temperature surface to the substrate;

a thermoelectric thick film material in thermal contact with the substrate; and, a multilayer stack structure disposed between the substrate and the thermoelectric material, the multilayer stack structure comprising thermally and electrically conductive layers for supplying heat from the substrate to the thermoelectric material and drawing current from the thermoelectric material.

2. The device of claim 1, wherein the thermoelectric material is a thick thermoelectric film deposited directly onto the multilayer stack structure.

3. The device of claim 1, wherein the thermoelectric material is a thermoelectric layer bonded directly onto the multilayer stack structure.

4. The device of claim 1, wherein the thermoelectric material is comprised by a series of alternating p and n-doped regions.

5. The device of claim 4, wherein each of the p-doped and n-doped regions in the alternating series are electrically connected in groups of legs to match a predetermined circuit.

6. The device of claim 1, wherein the thermoelectric material is $Bi_2Te_3$ or a $Bi_2Te_3$-based alloy.

7. The device of claim 1, wherein the substrate is attached directly to a heat-dissipating region of the high temperature surface.

8. The device of claim 1, wherein the high thermal conductivity material is selected from the group consisting of silicon carbide, boron nitride, aluminum nitride, or beryllium oxide.

9. The device of claim 1, wherein the stack structure is deposited directly onto the substrate.

10. The device of claim 1, wherein the stack structure comprises a metallic layer attached directly to the diamond or high thermal conductivity substrate.

11. The device of claim 10, wherein the stack structure further comprises a diffusion barrier layer for separating the metallic layer from the thermoelectric material.

12. The device of claim 10, wherein the stack structure comprises:
- a metallization layer attached to a surface of the diamond or high thermal conductivity substrate;
- an outer diffusion barrier layer attached to the metallization layer;
- an electrically conducting layer attached to the diffusion barrier layer;
- an inner diffusion barrier layer attached to the electrically conducting layer; and,
- a contact layer attached to the inner diffusion barrier layer.

13. The device of claim 1, further comprising a second stack structure attached to the thermoelectric material, and a second heat-conducting substrate attached to the second stack structure.

14. A microfabricated microgenerator for powering a low-power electronic component using a small temperature differential between a hot region and a cool region, comprising:
- a diamond or high thermal conductivity and low electrical conductivity substrate in thermal contact with the hot region;
- a thermoelectric material in thermal contact with the substrate; and,
- a stack structure disposed between the substrate and the thermoelectric material, the stack structure comprising:
  - a metallization layer attached to a surface of the substrate;
  - an outer diffusion barrier layer attached to the metallization layer;
  - an electrically conducting layer attached to the diffusion barrier layer;
  - an inner diffusion barrier layer attached to the electrically conducting layer; and,
  - a contact layer attached to the inner diffusion barrier layer.

15. A thermoelectric time keeping device, comprising:
- a package, having a skin abutting surface and another surface, which, when the skin abutting surface is abutting against the skin, is cooler than the skin abutting surface;
- electrical timekeeping circuitry, requiring electrical power for its operation, and having input terminals on which it receives the electrical power;
- a thermoelectric device having a first surface which is thermally coupled to the skin abutting surface, and a second surface which is cooler in operation than the first surface, and producing an electrical output, connected to the input terminals of the electrical timekeeping circuitry, said thermoelectric device including a high thermal conductivity and high electrical resistivity substrate in thermal contact with the first surface;
- a thermoelectric thick film material in thermal contact with the substrate;
- a multilayer stack structure disposed between the substrate and the thermoelectric material, the multilayer stack structure comprising thermally and electrically conductive layers for supplying heat from the substrate to the thermoelectric material and drawing power from the thermoelectric material and coupling said power to said input terminals; and
- an energy storage device, coupled to the electrical output.

16. The thermoelectric time keeping device of claim 15, wherein the second surface is thermally connected to the another surface.

* * * * *